(12) United States Patent
Ozawa

(10) Patent No.: US 9,431,823 B2
(45) Date of Patent: Aug. 30, 2016

(54) ESD PROTECTION CIRCUIT

(71) Applicant: MegaChips Corporation, Osaka (JP)

(72) Inventor: Tadashi Ozawa, Chiba (JP)

(73) Assignee: MegaChips Corporation, Osaka (JP)

( * ) Notice: Subject to any disclaimer, the term of this patent is extended or adjusted under 35 U.S.C. 154(b) by 15 days.

(21) Appl. No.: 14/489,097

(22) Filed: Sep. 17, 2014

(65) Prior Publication Data

US 2015/0077890 A1    Mar. 19, 2015

(30) Foreign Application Priority Data

Sep. 17, 2013  (JP) ................................. 2013-192388

(51) Int. Cl.
  *H02H 9/04*   (2006.01)
  *H01L 27/02*  (2006.01)

(52) U.S. Cl.
  CPC .......... *H02H 9/046* (2013.01); *H01L 27/0248* (2013.01)

(58) Field of Classification Search
  CPC .............. H02H 9/046; H01L 27/0248; H01L 27/0255; H01L 27/248
  USPC ......................................................... 361/56
  See application file for complete search history.

(56) References Cited

U.S. PATENT DOCUMENTS

| | | | |
|---|---|---|---|
| 9,013,845 B1 * | 4/2015 | Karp ........................ | H02H 3/20 361/56 |
| 2004/0136126 A1 * | 7/2004 | Smith ................. | H01L 27/0251 361/56 |
| 2005/0237681 A1 * | 10/2005 | Chen ...................... | H02H 9/046 361/56 |
| 2006/0220709 A1 * | 10/2006 | Byeon .................. | H03K 17/223 327/143 |
| 2009/0316316 A1 * | 12/2009 | Shiota ................. | H01L 27/0285 361/56 |
| 2012/0257317 A1 * | 10/2012 | Abou-Khalil ....... | H01L 27/0262 361/56 |
| 2012/0307410 A1 | 12/2012 | Yamazaki et al. | |

FOREIGN PATENT DOCUMENTS

| | | |
|---|---|---|
| JP | 2010-050312 A | 3/2010 |
| JP | 2012-195778 A | 10/2012 |
| JP | 2012-253241 A | 12/2012 |

* cited by examiner

*Primary Examiner* — Stephen W Jackson
*Assistant Examiner* — Christopher Clark
(74) *Attorney, Agent, or Firm* — Osha Liang LLP

(57) ABSTRACT

In an ESD protection circuit, the overvoltage detection circuit detects application of an overvoltage to a power supply node. A clamp circuit connects the power supply node to a ground node to clamp a voltage of the power supply node. A voltage regulation circuit drops the voltage of the power supply node to generate a predetermined regulated voltage to be supplied to the overvoltage detection circuit as a power supply voltage. At the predetermined regulated voltage, the overvoltage detection circuit is not activated at Power-On, and is activated under ESD events. A voltage compensation circuit compensates for the voltage of the detection signal, so that the voltage of the detection signal becomes equal to the overvoltage, when the overvoltage is applied to the power supply node.

8 Claims, 4 Drawing Sheets

ESD PROTECTION CIRCUIT

CROSS-REFERENCE TO RELATED APPLICATIONS

The present application claims priority under 35 U.S.C. §119 to Japanese Patent Application No. 2013-192388, filed Sep. 17, 2013. Each of the above application is hereby expressly incorporated by reference, in its entirety, into the present application.

BACKGROUND OF THE INVENTION

Embodiments of the present invention relate to electrostatic discharge (ESD) protection circuits that prevent internal circuits in a semiconductor integrated circuit from being damaged by an overvoltage under ESD events applied to a power supply node in the semiconductor integrated circuit.

FIG. 6 is a block diagram illustrating an example configuration of prior art ESD protection circuits. The ESD protection circuit 30 shown in FIG. 6 is an active clamp-type power supply ESD protection circuit described in FIG. 1 of JP 2012-253241 A (hereinafter referred to as Patent Document 1), and is formed of an overvoltage detection circuit 12 and a clamp circuit 14.

The overvoltage detection circuit 12 is provided to detect an overvoltage (e.g. 3 V) under ESD events to the power supply node, which is higher than a power supply voltage VDD (e.g. 1.1 V) under normal operation, and to output a detection signal. The overvoltage detection circuit 12 is formed of an RC time constant circuit 20 having a resistive element R and a capacitive element C, and an inverter 22 having a PMOS (P-type MOS transistor) MP1 and an NMOS (N-type MOS transistor) MN1.

The resistive element R and the capacitive element C of the RC time constant circuit 20 are serially connected between the power supply node and a ground node to which a ground voltage VSS is supplied under normal operation.

The PMOS MP1 and the NMOS MN1 of the inverter 22 are serially connected between the power supply node and the ground node, and have their gates to which an output signal n1 of the RC time constant circuit 20 is inputted. The output signal n1 is outputted by an internal node n1 located between the resistive element R and the capacitive element C. The inverter 22 inversely-outputs the output signal n1 of the RC time constant circuit 20, as the detection signal described above.

In response to the detection signal, when an overvoltage to the power supply node is detected, the clamp circuit 14 connects the power supply node to the ground node to allow a large current due to the overvoltage applied to the power supply node to flow to the ground node, to clamp the voltage of the power supply node so as to protect internal circuits of a semiconductor integrated circuit operating on the power supply voltage VDD. The clamp circuit 14 is formed of an NMOS MN0.

The NMOS MN0 is connected between the power supply node and the ground node, and has its gate to which an output signal of the inverter 22, i.e., a detection signal n0, is inputted. The detection signal n0 is outputted from an internal node n0 located between the PMOS MP1 and the NMOS MN1.

Next, operation of the ESD protection circuit 30 will be described.

Under normal operation, when a power supply voltage VDD is supplied to the power supply node, the capacitive element C is charged to the power supply voltage VDD. Accordingly, the output signal n1 of the RC time constant circuit 20 keeps high level (H). The PMOS MP1 is in OFF state, and the NMOS MN1 is in ON state. Then the detection signal n0 keeps low level (L), and the NMOS MN0 is in OFF state. Thus, the ESD protection circuit 30 under the normal operation has no effect to the internal circuits operating on the power supply voltage VDD.

Under ESD events, when an overvoltage is applied to the power supply node, the power supply node rises steeply, while the output signal n1 of the RC time constant circuit 20 rises slower than the power supply node, due to the behavior of the RC time constant circuit 20. Accordingly, the output signal n1 of the RC time constant circuit 20 becomes L for a period until the capacitive element C is charged by the overvoltage through the resistive element R, that is, for a period of the time constant RC supplied from the RC time constant circuit 20. The detection signal n0 becomes H, for a period corresponding to the time constant RC, and then the NMOS MN0 is turned ON.

Thus, under ESD events, a large current due to the overvoltage applied to the power supply node is allowed to flow to the ground node through the NMOS MN0, so that the voltage of the power supply node is clamped to protect the internal circuits operating on the power supply voltage VDD.

As described above, the prior art ESD protection circuit 30 of active clamp-type power supply is designed such that the activation of the ESD protection circuit 30 is to be triggered by the RC time constant circuit 20 based on the assumption of steep rising of the overvoltage applied to the power supply node under ESD events. However, even when such steep rising of the power supply voltage VDD is caused as a result of applied voltage to the power supply node at Power-On, the prior art ESD protection circuit 30 can operate as if it is under ESD events, allowing the large current flow from the power supply node to the ground node through the NMOS MN0.

Next, simulation results performed on the prior art ESD protection circuit 30 at Power-On will be described.

In this simulation, as shown in the upper left part in FIG. 7, three different predetermined voltages: a power supply voltage VDD under normal operation, i.e., 1.1 V; a voltage between the power supply voltage VDD under normal operation and the overvoltage under ESD events, i.e., 2 V; and an example overvoltage to be applied to the power supply node under ESD events, i.e., 3 V; are supplied to the power supply node with a rising time of 1 ns (the voltage of the power supply node is raised to each predetermined voltage in 1 ns), and each current that flows through the NMOS MN0 as indicated by the arrow in the right part in FIG. 7 is measured.

FIG. 8 is a graph showing simulation results of the ESD protection circuit at Power-On shown in FIG. 6. In this graph, the vertical axis represents current (A), and the horizontal axis represents time period (μs).

As shown in the graph, when a power supply voltage VDD under normal operation, i.e., 1.1 V is supplied to the power supply node in a rising time of 1 ns (VDD=1.1 V (1.1 V/ns)), a current flows through the NMOS MN0. Thus in this case, it can be seen that the NMOS MN0 is turned ON, immediately after Power-On and kept to be in ON state for a period corresponding to a time constant RC of the RC time constant circuit 20.

The results also shows that when 2 V which represents the voltage between the power supply voltage VDD under normal operation and the overvoltage under ESD events is supplied to the power supply node in a rising time of 1 ns (VDD=2 V (2 V/ns)), as well as when the example overvoltage 3 V is applied to the power supply node under ESD events in a rising time of 1 ns (VDD=3 V (3 V/ns)), the NMOS MN0 is turned ON for a period corresponding to the time constant RC of the RC time constant circuit 20, in either case.

From the above simulation results, it can be seen that the prior art ESD protection circuit 30 can act in a similar way as it is under ESD events, even when the power supply voltage VDD under normal operation is supplied to the power supply node in a steeply.

It can also be seen from the graph in FIG. 8, that when the rising of the power supply voltage VDD is steep, even 1.1 V of the power supply voltage VDD under normal operation can cause a current about 600 mA to flow for a period of 1 µs order. In an actual semiconductor integrated circuit, a plurality of the ESD protection circuits 30 shown in FIG. 6, may be laid out. For example, if a semiconductor integrated circuit has ten ESD protection circuits 30, a current about 6 A will flow for a time period of 1 µs order.

Therefore, for example, when the power supply voltage VDD rises steeply at Power-On, as in a hot-pluggable device, the ESD protection circuit 30 laid out on the device may malfunction at Power-On, which causes an excessively large current relative to the driving capacity of the power supply to flow. In that case, the device may not be allowed to start normally, and in a worst case, the power supply may oscillate.

In addition to the Patent Document 1 previously described, there are several related prior art documents, including, JP 2010-50312 A (hereinafter referred to as Patent Document 2) and JP 2012-195778 A (hereinafter referred to as Patent Document 3).

Patent Document 2 relates to ESD protection circuits that prevent internal circuits in a semiconductor integrated circuit from electrostatic discharging.

Patent Document 2 describes an ESD protection circuit which detects a voltage difference between a power supply and a ground to output it as a first detection signal so that the power supply and the ground are electrically connected once the first detection signal reaches a first threshold voltage between the power supply voltage under normal operation and the ground. The ESD protection circuit determines whether the voltage difference between the first detection signal and the ground reaches a second threshold voltage which is higher than the power supply voltage under normal operation, to output it as a second detection signal. Once the second detection signal reaches the second threshold voltage, the level of the first detection signal is controlled.

Patent Document 3 relates to ESD protection circuits for preventing internal circuits from being damaged by ESD.

In Patent Document 3, an ESD protection circuit is described, in which a first ESD pulse detection signal is outputted for a first predetermined period from the start of ESD event to a power supply terminal. A second ESD pulse detection signal is outputted for a third predetermined period, after the first ESD pulse signal is outputted and when the ESD event to the power supply terminal is maintained for a second predetermined period. The first predetermined period is determined to be shorter than the rising time of the power supply. The second predetermined period is determined to be shorter than the first predetermined period and longer than the application period of a spike noise to the power supply terminal. The third predetermined period is determined to be longer than the application period of the ESD pulse to the power supply terminal. When neither of the first ESD pulse detection signal and the second ESD pulse detection signal is outputted, a gate of an ESD protection driver that discharges the ESD pulse applied to the power supply terminal to a GND terminal, is connected to the GND terminal. When at least one of the first ESD pulse detection signal and the second ESD pulse detection signal is outputted, the gate of the ESD protection driver is insulated from the GND terminal. When the second ESD pulse detection signal is outputted, the gate of the ESD protection driver is connected to the power supply terminal. When the second ESD pulse detection signal is not outputted, the gate of the ESD protection driver is insulated from the power supply terminal.

SUMMARY OF THE INVENTION

Although the ESD protection circuit of Patent Document 2 aims at similar effects as embodiments of the present invention, its configuration is completely different from those embodiments of the present invention. For example, a voltage monitor circuit is used in the prior art ESD protection circuit. Further, one or more embodiments of the present invention need fewer components than required for the ESD protection circuit of Patent Document 2.

The ESD protection circuit of Patent Document 3 also aims at similar effects as embodiments of the present invention. However, it differs from the ESD protection circuit of one or more embodiments of the present invention in that it controls the gate of the clamp MOS of the ESD protection driver depending on the time period of variation of the power supply voltage. In addition, the ESD protection circuit of Patent Document 3 may malfunction in some cases because operation time windows are controlled based on an expected profile of the voltage variation.

One or more embodiments of the present invention provide an ESD protection circuit which does not malfunction, even when the power supply voltage VDD is supplied with a rapid slew rate, to the power supply node at Power-On.

One or more embodiments of the present invention provide an ESD protection circuit including: an overvoltage detection circuit, which detects application of an overvoltage under ESD events to a power supply node and outputs a detection signal, the overvoltage under ESD events being higher than a power supply voltage under normal operation; a clamp circuit, which, in response to the detection signal, connects the power supply node to a ground node to clamp a voltage of the power supply node, when the application of the overvoltage to the power supply node is detected; a voltage regulation circuit, which drops the voltage of the power supply node to generate a predetermined regulated voltage, wherein at the predetermined regulated voltage, the overvoltage detection circuit is not activated when the power supply voltage under normal operation is supplied to the power supply node at Power-On, and the overvoltage detection circuit is activated when the overvoltage under ESD events is applied to the power supply node, the predetermined regulated voltage being supplied as a power supply voltage for the overvoltage detection circuit; and a voltage compensation circuit, which compensates for a voltage of the detection signal which is dropped since the overvoltage detection circuit operates on the regulated voltage, so that the voltage of the detection signal becomes equal to the overvoltage, when the overvoltage is applied to the power supply node.

In the ESD protection circuit in accordance with one or more embodiments of the present invention, because the overvoltage detection circuit operates on a regulated voltage, the ESD protection circuit does not malfunction on a power supply voltage under normal operation, even with any slew rate, while ensuring proper operation under ESD events. Meanwhile, in the ESD protection circuit of one or more embodiments of the present invention, when an overvoltage is applied to the power supply node, the voltage level of the detection circuit is compensated for the same level as the overvoltage, so that the driving capacity of the same level as the clamp circuit of the prior art ESD protection circuit can be attained.

The ESD protection circuit in accordance with one or more embodiments of the present invention further provides other advantages such as, eliminated concern about dead windows, easy to control the leakage current, reduced area impact due to the smaller size diodes which form the voltage regulation circuit.

DETAILED DESCRIPTION OF THE INVENTION

The ESD protection circuit in accordance with embodiments of the present invention will be described in more detail with reference to the accompanying figures.

Figure 1:
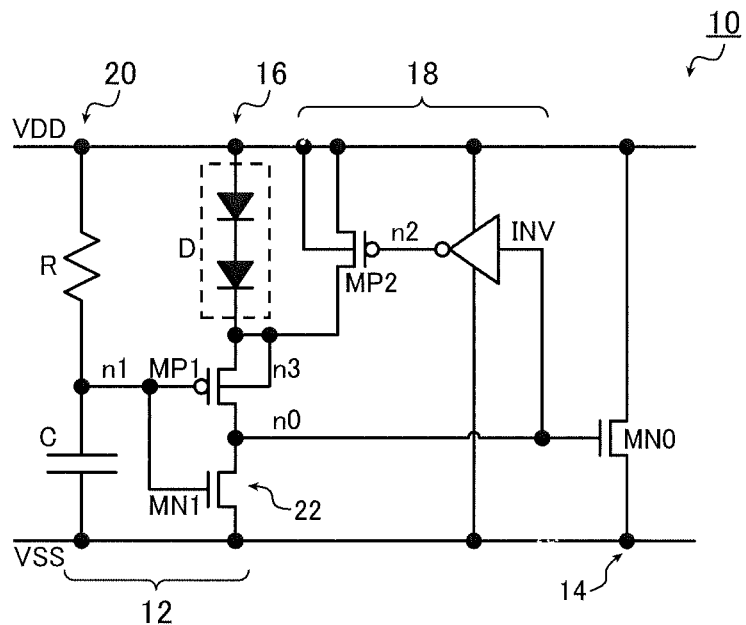
FIG. 1 is a block diagram illustrating a configuration of the ESD protection circuit according to one or more embodiments of the present invention.
Figure 6:
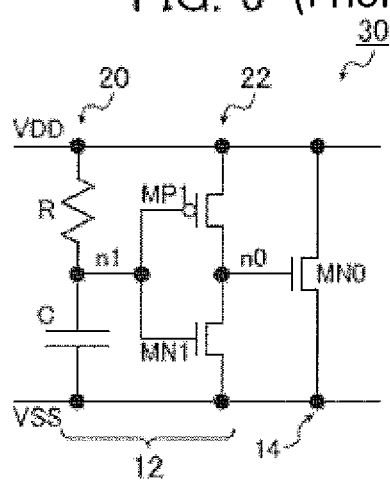
FIG. 6 is an example block diagram illustrating a configuration of a prior art ESD protection circuit.
Figure 7:
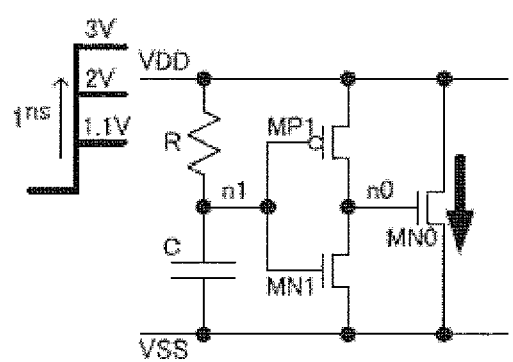
FIG. 7 is a schematic diagram illustrating behavior at Power-On of the ESD protection circuit shown in FIG. 6.
Figure 8:
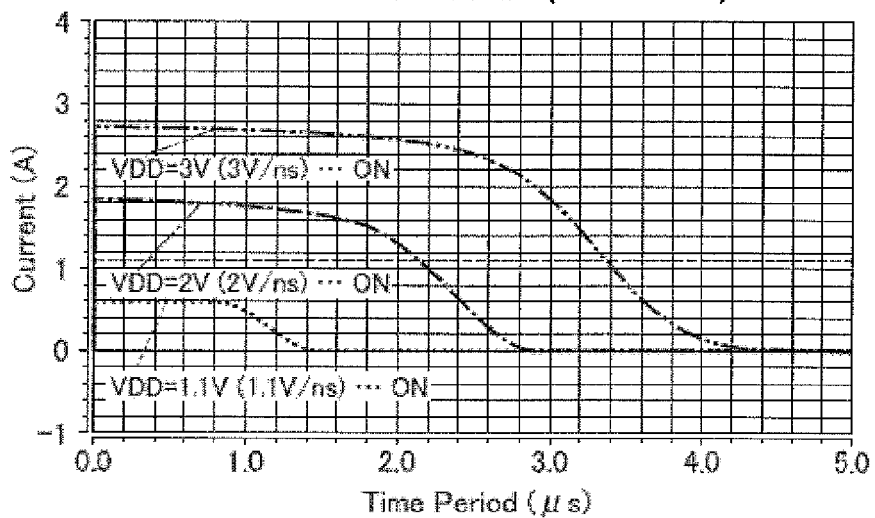
FIG. 8 is a graph showing simulation results of the ESD protection circuit at Power-On shown in FIG. 6.

FIG. 1 is a block diagram illustrating the configuration of the ESD protection circuit in accordance with one or more embodiments of the present invention. An ESD protection circuit 10 shown in FIG. 1 is designed by utilizing one or more embodiments of the present invention to the prior art ESD protection circuit 30 shown in FIG. 6, and additionally includes a voltage regulation circuit 16, and a voltage compensation circuit 18.

That is, the ESD protection circuit 10 is formed of an overvoltage detection circuit 12, a clamp circuit 14, a voltage regulation circuit 16, and a voltage compensation circuit 18.

Because the configurations of the overvoltage detection circuit 12 and the clamp circuit 14 are the same as those of the prior art ESD protection circuit 30, detailed description of them are omitted.

The overvoltage detection circuit 12 is provided to detect that an overvoltage (e.g., 3 V) is applied to the power supply node under ESD events, which is higher than a power supply voltage VDD (e.g., 1.1 V) applied to the power supply node under normal operation and to output a detection signal n0. The overvoltage detection circuit 12 is formed of an RC time constant circuit 20 having a resistive element R and a capacitive element C, and an inverter 22 having a PMOS MP1 and a NMOS MN1.

In accordance with detection signal n0, when the overvoltage to the power supply is detected, the clamp circuit 14 connects the power supply node to a ground node. Then clamp circuit 14 allows a large current, due to the overvoltage applied to the power supply node, to flow to the ground node. The reason to clamp the voltage of the power supply node is to protect the internal circuits which operating on the power supply voltage VDD. The clamp circuit 14 is formed of a NMOS MN0.

The voltage regulation circuit 16 is provided to drop the voltage of the power supply node to generate a regulated voltage, the PMOS MP1 is not turned ON when the power supply voltage VDD under normal operation is supplied to the power supply node at Power-On. And PMOS MP1 is turned ON when an overvoltage is applied to the power supply node under ESD events. The regulated voltage is supplied to the substrate and the source of the PMOS MP1 as a power supply voltage for the inverter 22.

The voltage regulation circuit 16 is formed of serially-connected diodes D.

The diodes D are connected in a forward direction from the power supply node toward the substrate and the source of the PMOS MP1 of the inverter 22.

The drop voltage by the voltage regulation circuit 16 should be determined based on various factors such as a power supply voltage VDD, a threshold voltage Vth of the PMOS MP1, an overvoltage Vesd at which protection under ESD events should be done. Also the drop should be appropriately varied according to the number of the diodes D.

When the regulated voltage becomes lower than the threshold voltage Vth, the PMOS MP1 is not activated. Therefore, the drop voltage needs to be higher than (VDD−Vth). However, if the drop voltage is too high, the PMOS MP1 is not activated, even when the overvoltage Vesd is applied to the power supply node. Therefore, the drop voltage needs to be lower than (Vesd−Vth).

For example, when the power supply voltage VDD=1.1 V, the threshold voltage Vth=0.6 V, and the overvoltage Vesd=3 V, the drop voltage should be determined to be higher than (VDD−Vth)=1.1−0.6=0.5 V, and lower than (Vesd−Vth)=3−0.6=2.4 V.

The voltage compensation circuit 18 is provided to compensate for the voltage of the detection signal n0 which is dropped since the inverter 22 operates on the regulated voltage, when an overvoltage under ESD events is applied to the power supply node, so that the voltage of the detection signal n0 becomes equal to the overvoltage under ESD events. The voltage compensation circuit 18 is formed of an inverter INV, and a PMOS MP2.

The inverter INV operates on a voltage between the power supply node and the ground node, and receives an output signal, i.e., the detection signal n0, which is outputted from the inverter 22 to an internal node n0. The inverter INV inversely-outputs the detection signal n0.

The PMOS MP2 is connected between the power supply node, and the substrate and the source of the PMOS MP1. The substrate of the PMOS MP2 is connected to the power supply node, and the gate of the PMOS MP2 receives the output signal of the inverter INV, i.e., an inverted signal n2 of the detection signal n0 which is outputted to an internal node n2.

The operation of the ESD protection circuit 10 will be described.

First, when a power supply voltage VDD is supplied to the power supply node at Power-On, the power supply node rises rapidly, while an output signal n1 of the RC time constant circuit 20 rises more slowly than the power supply node due to the behavior of the RC time constant circuit 20. Therefore, the output signal n1 of the RC time constant circuit 20 becomes L for a period corresponding to a time constant RC of the RC time constant circuit 20, but the PMOS MP1 is not turned ON because a regulated voltage is supplied to the substrate and the source of the PMOS MP1 from the voltage regulation circuit 16. In that case, the detection signal n0 is L, the NMOS MN0 is in OFF state, the output signal n2 of the inverter INV is H, and the PMOS MP2 is in OFF state.

Therefore, the NMOS MN0 is never turned ON, when the power supply voltage VDD is supplied to the power supply node at Power-On, in other words, the ESD protection circuit 10 is not activated.

When the power supply voltage VDD is supplied to the power supply node, the capacitive element C is charged to the power supply voltage VDD after the period of time constant RC in normal operation. In that case, the internal node n1 is H, the PMOS MP1 is in OFF state, the NMOS MN1 is in ON state, the detection signal n0 is L, the NMOS MN0 is in OFF state, the output signal n2 of the inverter INV is H, and the PMOS MP2 is in OFF state.

On the other hand, when an overvoltage is applied to the power supply node under ESD events, the power supply node rises rapidly, while the output signal n1 of the RC time constant circuit 20 rises more slowly than the power supply node, due to the behavior of the RC time constant circuit 20. Therefore, the output signal n1 of the RC time constant circuit 20 becomes L for a period with the time constant RC of the RC time constant circuit 20. Since the regulated voltage supplied to the substrate and the source of the PMOS MP1 is high enough to operate the PMOS MP1, the PMOS MP1 is turned ON, the NMOS MN1 is turned OFF, the detection signal n0 becomes H for a period with the time constant RC, and the NMOS MN0 is turned ON.

Therefore, under ESD events, a large current due to the overvoltage applied to the power supply node is allowed to flow to the ground node through the NMOS MN0, to clamp the voltage of the power supply node, so that the internal circuits operating on the power supply voltage VDD should be protected.

Also, when the detection signal n0 becomes H, then the output signal n2 of the inverter INV becomes L, and the PMOS MP2 is turned ON. Thereby the overvoltage is supplied to the substrate and the source of the PMOS MP1 through the PMOS MP2, and H of the detection signal n0 becomes equal to the overvoltage.

Thus, the driving capability of the NMOS MN0 should be increased to the same level as the NMOS MN0 of the prior art ESD protection circuit 30.

Next, simulation results performed on the ESD protection circuit 10 of one or more embodiments of the present invention at Power-On will be described.

Figure 2:
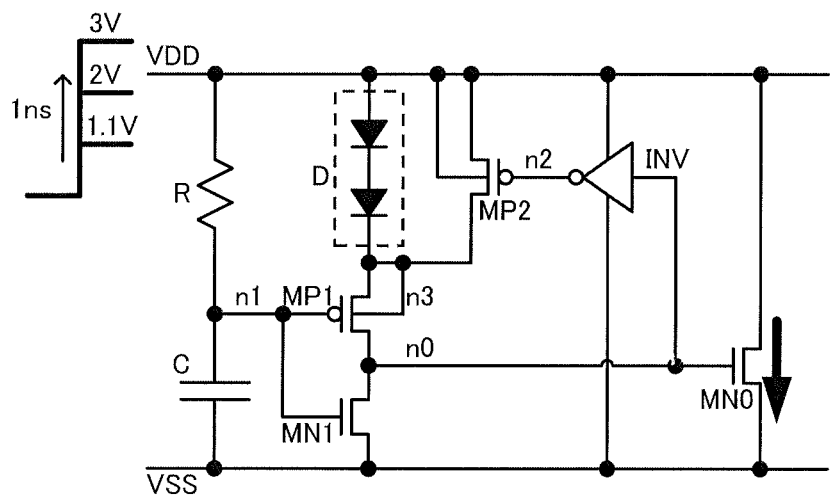
FIG. 2 is a schematic diagram illustrating behavior at Power-On of the ESD protection circuit shown in FIG. 1.

In this simulation, as shown in the upper left part of FIG. 2, three different predetermined voltages: a power supply voltage VDD under normal operation, i.e., 1.1 V; a voltage between the power supply voltage VDD under normal operation and the overvoltage under ESD events, i.e., 2 V; and an example overvoltage to be applied to the power supply node under ESD events, i.e., 3 V; are supplied to the power supply node with a rising time of 1 ns (the voltage of the power supply node is raised to the predetermined voltage in 1 ns), and each current that flows through the NMOS MN0 as indicated by the arrow mark in the right part of FIG. 2 is measured.

Figure 3:
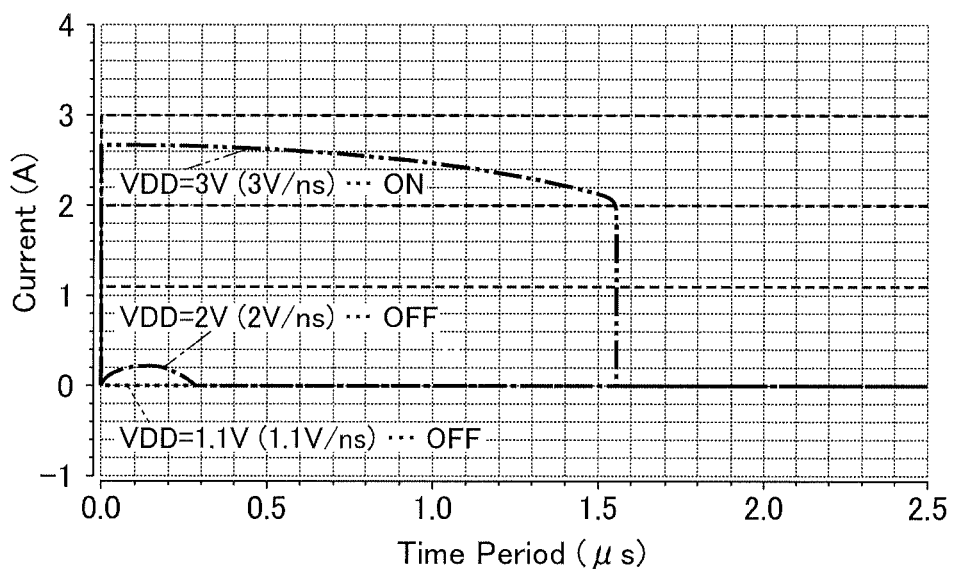
FIG. 3 is a graph showing simulation results at Power-On of the ESD protection circuit shown in FIG. 1.

FIG. 3 is a graph showing simulation results at Power-On of the ESD protection circuit shown in FIG. 1. In this graph, the vertical axis represents current (A), and the horizontal axis represents time period (μs).

As shown in this graph, when the power supply voltage VDD under normal operation, i.e., 1.1 V is supplied to the power supply node with a rising time of 1 ns (VDD=1.1 V (1.1 V/ns)), no current flows through the NMOS MN0. That is, in this case, the NMOS MN0 is kept in OFF state.

If a voltage between the power supply voltage VDD under normal operation and the overvoltage under ESD events, i.e., 2 V is supplied to the power supply node with a rising time of 1 ns (VDD=2 V (2 V/ns)), no current flows through the NMOS MN0, although a small current flows through it for a while just after Power-On. That is, it can be seen that, in this case, the NMOS MN0 is turned ON for a predetermined period only just after Power-On, and then turned OFF.

When 3 V, which is an example overvoltage to be applied to the power supply node under ESD events, is supplied to the power supply node with a rising time of 1 ns (VDD=3 V (3 V/ns)), a large current flows through the NMOS MN0 just after Power-On for a predetermined period, as in the prior art ESD protection circuit 30. That is, it can be seen that, in this case, the NMOS MN0 is turned ON, just after Power-On, for a period corresponding to the time constant RC of the RC time constant circuit 20.

Therefore, the ESD protection circuit 10 of this embodiment acts in the same way as the prior art ESD protection circuit 30, when an overvoltage is applied to the power supply node under ESD events. Also, the current waveform of the NMOS MN0 at Power-On has steep rising, and it shows that delay in the feedback route from the detection signal n0→the inverter INV→the internal node n2→the PMOS MP2 is sufficiently small.

The above simulation results show that the ESD protection circuit 10 of this embodiment acts under the ESD events, and does not malfunction on the power supply voltage VDD under normal operation even with any slew rate, because the overvoltage detection circuit 12 operates on a regulated voltage.

Further, there are other advantages, such as eliminated concern about dead windows in the ESD protection circuit 10, easy to control leakage current, reduced area impact due to the smaller size of the diodes D forming the voltage regulation circuit 16.

In the following section, dead windows will be described briefly.

Figure 9:
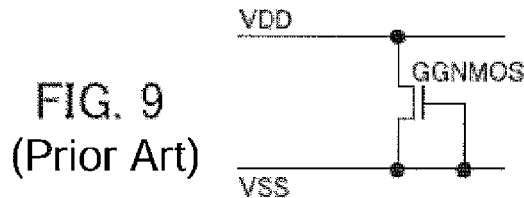
FIG. 9 is an example block diagram showing the configuration of a prior art voltage-trigger ESD protection circuit.

A voltage-trigger ESD protection circuit shown in FIG. 9 is known as a prior art ESD protection circuit. The ESD protection circuit shown in FIG. 9 is formed of an NMOS also called as GGNMOS (Gate Grounded NMOS).

The GGNMOS is connected between the power supply node and the ground node, and has its gate connected to the ground node.

Figure 10:
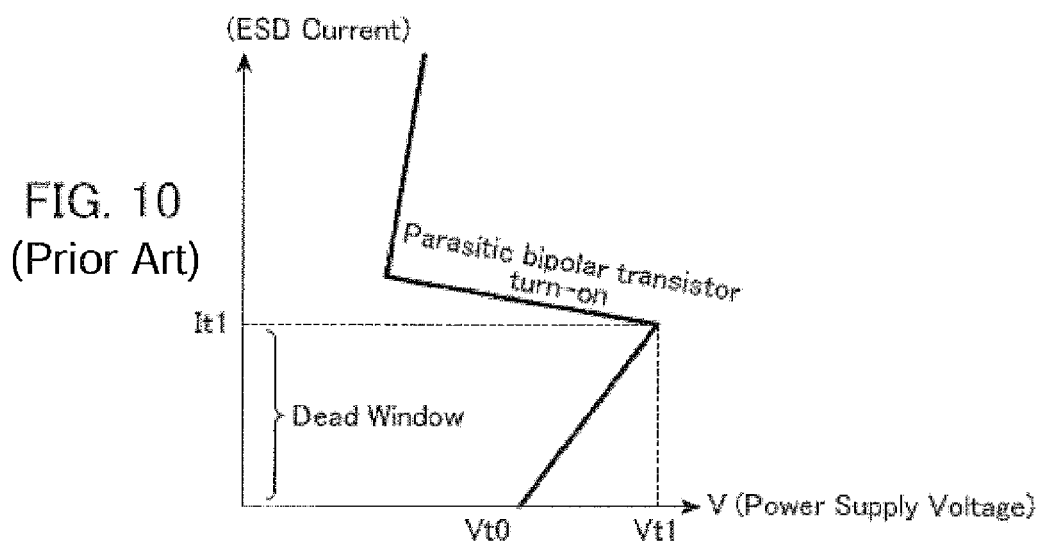
FIG. 10 is a graph illustrating current/voltage characteristics of a GGNMOS which forms the ESD protection circuit shown in FIG. 9.

FIG. 10 is a graph showing current/voltage characteristics of the GGNMOS forming the ESD protection circuit shown in FIG. 9. In the graph shown in FIG. 10, the vertical axis represents source-drain current (ESD current) (I) of the GGNMOS, and the horizontal axis represents source-drain voltage (power supply voltage) (V) of the GGNMOS.

As shown in this graph, the GGNMOS is turned OFF under ESD events. As the current increases due to the overvoltage applied to the power supply node, the voltage of the power supply node increases from the first predetermined voltage Vt0. When the current due to the overvoltage reaches a predetermined current value of It1, then the voltage of the power supply node reaches a turn-on voltage Vt1 for a parasitic bipolar transistor of the GGNMOS, to cause the parasitic bipolar transistor of the GGNMOS to be turned ON. This causes the power supply node and the ground node to be connected through the GGNMOS. And the current due to the overvoltage applied to the power supply node should be flowed to the ground node through the GGNMOS to clamp the voltage of the power supply node.

The voltage-trigger GGNMOS, however, may have a risk in that, if a current lower than a point at which the parasitic bipolar transistor of the GGNMOS is turned on, flows into the power supply node under ESD events, the voltage of the power supply node may not increase to the turn-on voltage Vt1 of the parasitic bipolar transistor of the GGNMOS, and a trigger may not be activated, which causes the power supply voltage to be kept at high voltage, resulting in damaged internal circuits operating on the supply voltage. That is, there exists a region called "dead window", which is considered to be a structural problem with the GGNMOS, where the voltage is continuously applied without turning on the parasitic bipolar transistor. The dead window occurs when the power supply voltage is higher than the absolute maximum rating and lower than the turn-on voltage Vt1, and the ESD current is lower than the current value It1. Thus, in addition to the risk of internal circuits (elements to be protected) being damaged, the GGNMOS should be damaged.

It should be appreciated that components for forming the ESD protection circuit of one or more embodiments of the present invention are not limited to those described above and shown in figures.

Figure 4:
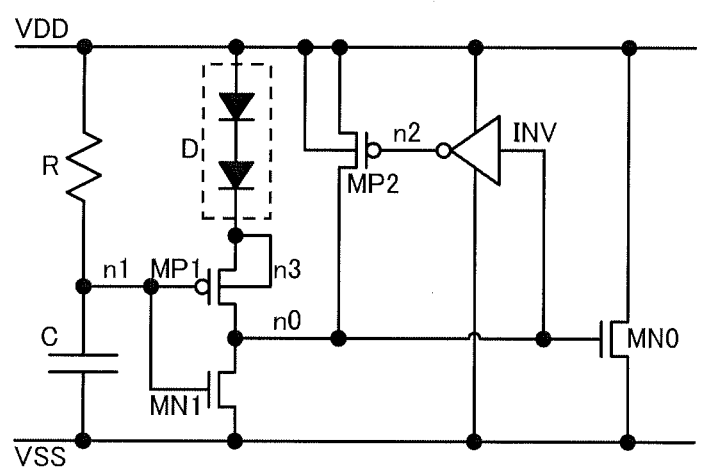
FIG. 4 is a block diagram illustrating a configuration of the ESD protection circuit according to another one or more embodiments of the present invention.

For example, the PMOS MP2 may be connected between the power supply node and the detection signal n0 as shown in FIG. 4. In this case, also, when the detection signal n0 under ESD events becomes H for a period corresponding to the time constant RC, the voltage of the detection signal n0 can be increased to the same voltage as the prior art ESD protection circuit 30, so as to enhance the driving capability of the NMOS MN0 to the same level as the NMOS MN0 of the prior art ESD protection circuit 30.

Figure 5:
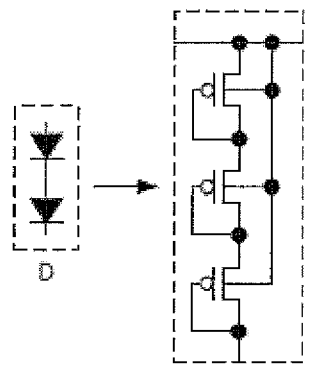
FIG. 5 is a block diagram of another one or more embodiments illustrating a voltage regulation circuit shown in FIG. 1 and FIG. 4.

Also, the voltage regulation circuit may use a predetermined number of diode-connected PMOSs, instead of the diodes D, as shown in FIG. 5. The voltage regulation circuit shown in FIG. 5 is formed of three PMOSs serially connected between the power supply node, and the substrate and the source of the PMOS MP1. Each substrate of the PMOSs is connected to the power supply node, and each gate of the PMOSs is connected to its drain.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An ESD protection circuit comprising:
    an overvoltage detection circuit that detects application of an overvoltage under ESD events to a power supply node and outputs a detection signal, wherein the overvoltage under ESD events is higher than a power supply voltage under normal operation;
    a clamp circuit that, in response to the detection signal, connects the power supply node to a ground node to clamp a voltage of the power supply node, when the application of the overvoltage to the power supply node is detected;
    a voltage regulation circuit that drops the voltage of the power supply node to generate a regulated voltage, wherein, at the regulated voltage, the overvoltage detection circuit is not activated when the power supply voltage under normal operation is supplied to the power supply node at Power-On, and wherein the overvoltage detection circuit is activated when the overvoltage under ESD events is applied to the power supply node, the regulated voltage being supplied as a supply voltage for the overvoltage detection circuit; and
    a voltage compensation circuit that compensates for a voltage of the detection signal which is dropped since the overvoltage detection circuit operates on the regulated voltage, so that the voltage of the detection signal becomes equal to the overvoltage, when the overvoltage is applied to the power supply node.

2. The ESD protection circuit of claim 1, wherein, the overvoltage detection circuit comprises:
    an RC time constant circuit comprising a resistive element and a capacitive element serially connected between the power supply node and the ground node, wherein the RC time constant circuit outputs a signal from between the resistive element and the capacitive element; and
    a first inverter comprising a P-type MOS transistor and an N-type MOS transistor serially connected between the regulated voltage and the ground node, wherein the first inverter inverts an output signal of the RC time constant circuit to output as the detection signal.

3. The ESD protection circuit of claim 1, wherein the clamp circuit comprises an N-type MOS transistor connected between the power supply node and the ground node, and wherein the detection signal is inputted to a gate of the N-type MOS transistor.

4. The ESD protection circuit of claim 2, wherein the voltage regulation circuit has a predetermined number of diodes serially connected in a forward direction from the power supply node toward a substrate and a source of the P-type MOS transistor of the first inverter.

5. The ESD protection circuit of claim 2, wherein the voltage regulation circuit has a predetermined number of diode-connected P-type MOS transistors that are serially connected between the power supply node, and a substrate and a source of the P-type MOS transistor of the first inverter.

6. The ESD protection circuit of claim 2, wherein the voltage compensation circuit comprises:
    a second inverter that operates on a voltage between the power supply node and the ground node, wherein the second inverter inversely-outputs the detection signal; and
    a P-type MOS transistor connected between the power supply node, and a substrate and a source of the P-type MOS transistor that forms the first inverter, wherein the power supply node is connected to the substrate of the P-type MOS transistor, and wherein an output signal of the second inverter is inputted to a gate of the P-type MOS transistor.

7. The ESD protection circuit of claim 1, wherein the voltage compensation circuit comprises:
a second inverter that operates on a voltage between the power supply node and the ground node, wherein the second inverter inversely-outputs the detection signal; and
a P-type MOS transistor connected between the power supply node and the detection signal, wherein the power supply node is connected to a substrate of the P-type MOS transistor, and wherein an output signal of the second inverter is inputted to a gate of the P-type MOS transistor.

8. The ESD protection circuit of claim 2, wherein the clamp circuit comprises an N-type MOS transistor connected between the power supply node and the ground node, and wherein the detection signal is inputted to a gate of the N-type MOS transistor.

\* \* \* \* \*